United States Patent
Lin et al.

(10) Patent No.: US 12,402,422 B2
(45) Date of Patent: Aug. 26, 2025

(54) NEAR INFRARED LIGHT SENSOR WITH IMPROVED LIGHT COUPLING AND CMOS IMAGE SENSOR INCLUDING SAME

(71) Applicant: Taiwan Semiconductor Manufacturing Company LTD, Hsinchu (TW)

(72) Inventors: ChunHao Lin, Tainan (TW); Yun-Wei Cheng, Taipei (TW); Kuo-Cheng Lee, Tainan (TW); Chien Nan Tu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 260 days.

(21) Appl. No.: 18/211,670

(22) Filed: Jun. 20, 2023

(65) Prior Publication Data
US 2024/0429261 A1 Dec. 26, 2024

(51) Int. Cl.
*H01L 21/00* (2006.01)
*G02B 5/20* (2006.01)
(Continued)

(52) U.S. Cl.
CPC ......... *H10F 39/184* (2025.01); *G02B 6/1226* (2013.01); *H10F 39/014* (2025.01);
(Continued)

(58) Field of Classification Search
CPC ... G02B 6/1226; H10F 39/014; H10F 39/024; H10F 39/184; H10F 39/8053; H10F 39/806; H10F 39/807
See application file for complete search history.

(56) References Cited

U.S. PATENT DOCUMENTS

| | | |
|---|---|---|
| 2019/0341419 A1 | 11/2019 | Kropelnicki et al. |
| 2021/0126038 A1 | 4/2021 | Kropelnicki et al. |

(Continued)

FOREIGN PATENT DOCUMENTS

| | | | | |
|---|---|---|---|---|
| CN | 107251224 A | * | 10/2017 | ............. B82Y 15/00 |
| TW | 201023126 A | | 6/2010 | |

(Continued)

OTHER PUBLICATIONS

English translation of CN-107251224-A (Year: 2017).*

*Primary Examiner* — Mark R Gaworecki
(74) *Attorney, Agent, or Firm* — Lippes Mathias LLP

(57) ABSTRACT

A near infrared sensing device includes a near infrared light sensor configured to detect infrared light at least at a design-basis infrared wavelength, and a surface plasmon polariton structure including at least an embedded grating that is embedded in a light-receiving surface of the near infrared light sensor. The surface plasmon polariton structure is configured to couple with light at the design-basis infrared wavelength to form a surface plasmon polariton at the light-receiving surface of the near infrared light sensor. The surface plasmon polariton structure may further include a metal grating disposed on the light-receiving surface of the near infrared light sensor and aligned with the embedded grating. The embedded grating may comprise an embedded metal grating that is embedded in the light-receiving surface of the near infrared light sensor, or trenches formed in the light-receiving surface of the near infrared light sensor and at least partially filled with air.

20 Claims, 5 Drawing Sheets

(51) Int. Cl.
  *G02B 6/122*  (2006.01)
  *H01L 23/00*  (2006.01)
  *H10F 39/00*  (2025.01)
  *H10F 39/18*  (2025.01)
(52) U.S. Cl.
  CPC ....... *H10F 39/024* (2025.01); *H10F 39/8053* (2025.01); *H10F 39/806* (2025.01); *H10F 39/807* (2025.01)

(56) References Cited

U.S. PATENT DOCUMENTS

| | | |
|---|---|---|
| 2022/0271094 A1 | 8/2022 | Dupoiron et al. |
| 2023/0084614 A1 | 3/2023 | Chen et al. |

FOREIGN PATENT DOCUMENTS

| | | |
|---|---|---|
| TW | 201545328 A | 12/2015 |
| TW | 201729403 A | 8/2017 |
| TW | 202101783 A | 1/2021 |
| TW | 202105702 A | 2/2021 |
| TW | 202118031 A | 5/2021 |

\* cited by examiner

NEAR INFRARED LIGHT SENSOR WITH IMPROVED LIGHT COUPLING AND CMOS IMAGE SENSOR INCLUDING SAME

BACKGROUND

The following relates to the semiconductor structure fabrication arts, semiconductor device fabrication arts, image sensor arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
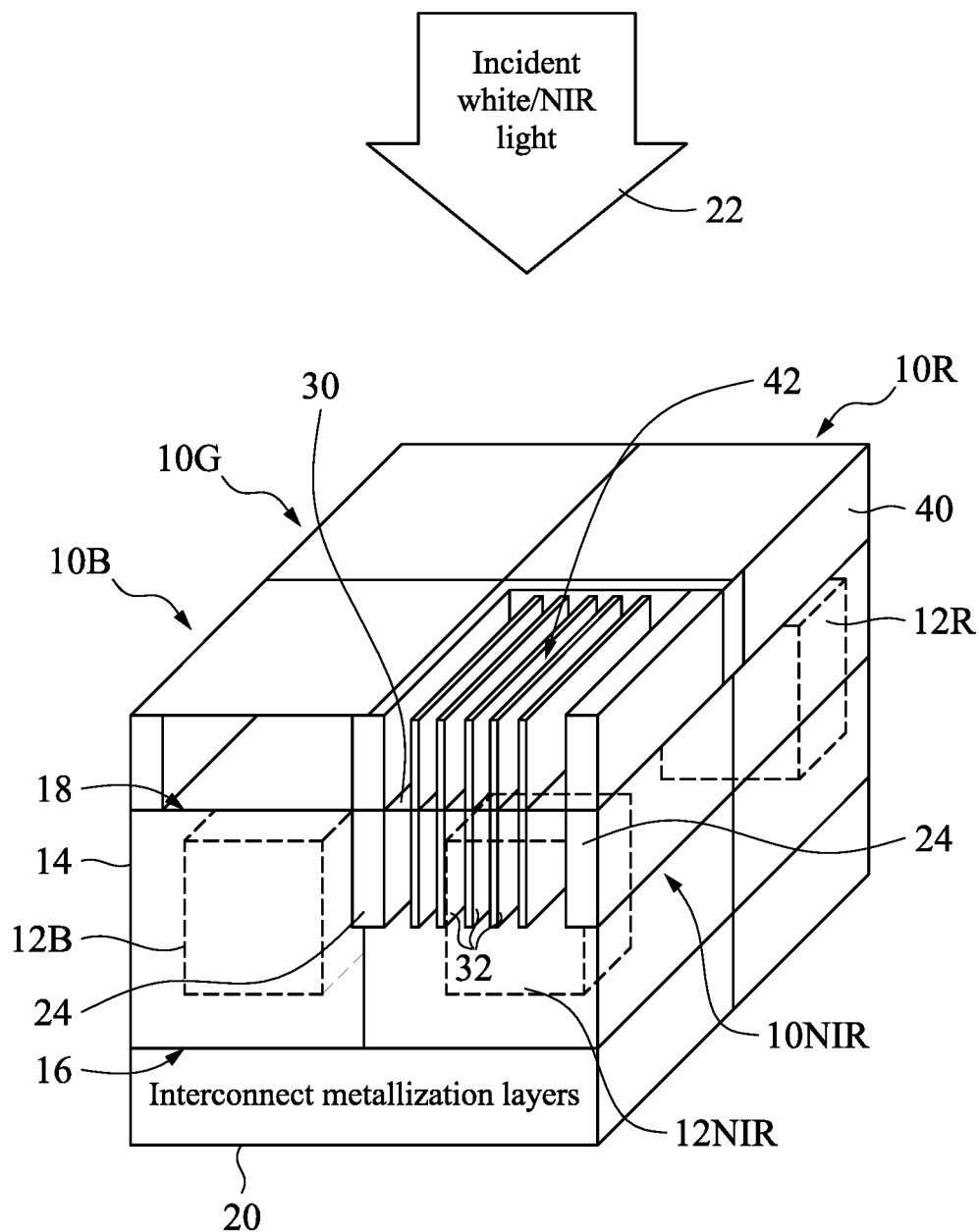
FIG. 1 diagrammatically illustrates a perspective view of a portion of a CMOS image sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integration of near infrared light sensors with an array of visible light sensors (e.g., red, green, and blue light sensors) has various applications. For example, a camera for a smartphone or the like with such an imaging array can employ the visible light sensors to obtain full-color images during daylight or in other well-lit conditions, while employing the near infrared light sensors to provide monochrome images at night or in other low light conditions. (In another possible imaging mode, both types of sensors could be used in low light conditions along with signal processing to fuse the visible and near infrared images so as to provide spatial resolution captured by the near infrared light sensors and colorizing captured by the visible light sensors). In another application, the near infrared sensors can be used in combination with a pulsed infrared light source to provide time-of-flight (TOF) based depth imaging. In this type of application, the near infrared light source is advantageously not visible to the user. These are merely some nonlimiting illustrative examples.

A complementary metal-oxide-semiconductor (CMOS) image sensor with color filters can provide a compact and low profile imaging array. However, further integrating infrared light sensors into such a CMOS image sensor is challenging. Typical CMOS semiconductor base materials such as silicon have significantly lower absorption of near infrared light compared with visible light. This difference becomes more problematic if the CMOS image sensor is to be made thin. For example, in some commercial CMOS imaging sensors, the silicon base material is a thinned silicon wafer having a thickness of between 2.5 micron and 10 micron. This leads to infrared light sensors built in this architecture having substantially lower quantum efficiency (QE) compared with the red, green, and blue (or other visible light) sensors. In some such CMOS image sensor designs, the near infrared light detectors may have a quantum efficiency at 940 nanometers of below 10% (i.e., QE<0.1). Various approaches can be employed to improve this, but these approaches can have disadvantages. For example, the base silicon material can be made thicker to provide for more infrared light absorption, but this leads to a higher overall thickness for the CMOS image sensor. Another approach can entail adding germanium to form the near infrared light detector as a germanium (Ge) material or as a silicon-germanium alloy ($Si_{1-x}Ge_x$ where $0<x\leq1$). This again can increase the QE of the near infrared light detectors, but increases overall design complexity and adds steps to the CMOS image sensor manufacturing workflow.

In embodiments disclosed herein, improved light absorption and improved QE for a near infrared light detector is obtained by incorporating a surface plasmon polariton structure at the light-receiving surface of the near infrared light detector. A surface plasmon polariton is an electromagnetic wave (here a near infrared light wave) that travels along the light-receiving surface, and combines electric charge motion (the surface plasmon component) and a standing electromagnetic wave in air or a dielectric material (the polariton component). The surface plasmon polariton structure is tuned to couple with light at the design-basis infrared wavelength (e.g., 940 nanometers in some nonlimiting illustrative examples) to form a surface plasmon polariton at the light-receiving surface of the near infrared light sensor, which is expected to increase the absorption by as much as a factor of five or more for typical silicon-based CMOS image sensor thicknesses of around 2.5 micron to 10 micron.

A further advantage of this approach is that in some embodiments disclosed herein the surface plasmon polariton structure is fabricated using existing CMOS image sensor manufacturing steps with minor modifications. For example, backside deep trench isolation (DTI) regions are typically formed to assist in electrically isolating the light sensors from one another. The photomask(s) used to form the DTI regions can be modified to additionally form trenches in the light receiving surfaces of the near infrared image sensors of the array, and these trenches then provide an embedded grating whose spacing is selected to configure the embedded grating to resonate at the design-basis infrared wavelength to support a standing wave that couples with charge carriers in the embedded grid and/or in the material at or near the light-receiving surface of the near infrared light sensor to thereby substantially increase optical coupling of the near infrared light sensor with light at the design-basis infrared wavelength. The embedded grating can comprise the DTI regions formed in the light-receiving surface and at least partially filled with air; or, the embedded grating can comprise the DTI regions filled with metal (e.g., tungsten) to form the embedded grating as an embedded metal grating.

In similar fashion, a metal layer is typically disposed on the array of light sensors and patterned to form a metal grid with gridlines running between the light sensors. This metal grid beneficially suppresses optical cross-talk between the light sensors of the array. The photomask(s) used to form the metal grid can be modified to additionally form metal gratings on the light receiving surfaces of the respective near infrared light sensors of the array. The spacing of the metal grating can be designed to resonate at the design-basis infrared wavelength to support a standing wave that couples with charge carriers in the metal grating and/or in the material at or near the light-receiving surface of the near infrared light sensor to thereby substantially increase optical coupling of the near infrared light sensor with light at the design-basis infrared wavelength.

In some illustrative embodiments, both the above-described embedded grid and the above-described metal grid are employed together, with the metal grid and the underlying embedded grid aligned, to form the surface plasmon polariton structure. Advantageously, as this surface plasmon polariton structure extends both above (via the metal grid) and below (via the embedded grid) the light receiving surface of the near infrared light sensor, the surface plasmon polariton is strengthened, thereby synergistically increasing the optical coupling of the near infrared light sensor at or around the design basis infrared wavelength.

With reference now to FIG. 1, a portion of a CMOS image sensor is diagrammatically shown in perspective view. The illustrative portion of the CMOS image sensor includes one blue light sensor 10B, one green light sensor 10G, one red light sensor 10R, and one near infrared light sensor 10NIR. The blue light sensor 10B includes a light sensing element or region 12B, the red light sensor 10R includes a light sensing element or region 12R, and the near infrared light sensor 10NIR includes a light sensing element or region 12NIR. Although not visible in the perspective view of FIG. 1, the green light sensor 10G similarly includes a light sensing element or region. The light sensing elements or regions 12B, 12R, 12NIR are formed in a semiconductor base material 14, such as a thinned silicon wafer. In some nonlimiting illustrative embodiments, the semiconductor base material 14 may be a thinned silicon wafer having a thickness (after thinning) in the range 2.5-10 microns, e.g. having a thickness of 2.5 micron, 3 micron, 6 micron, or 10 micron, as some specific examples. The light sensing elements or regions 12B, 12R, 12NIR may be fabricated on a front side 16 of the wafer while the back side 18 is supported on a support wafer (not shown) which is later removed. The light sensing elements or regions 12B, 12R, 12NIR may, for example, comprise photodiodes, such as p/n diodes, pinned photodiodes, or the like. In embodiments in which the base semiconductor 14 is silicon, the light sensing elements or regions 12B, 12R, 12NIR may be silicon photodiodes, silicon pinned photodiodes, or the like.

The light sensing element or region 12NIR of the near infrared light sensor 10NIR may optionally include germanium (Ge), for example included as an epitaxial layer of Ge or as a diffused, implanted, or otherwise-formed region of $Si_{1-x}Ge_x$ (where $0<x<1$) in the base silicon material. Inclusion of germanium or $Si_{1-x}Ge_x$ in the light sensing element or region 12NIR of the near infrared light sensor 10NIR can enhance QE due to higher infrared light absorption (a consequence of the germanium or $Si_{1-x}Ge_x$ having a lower bandgap than silicon). In some such embodiments, the germanium or $Si_{1-x}Ge_x$ material may be biaxially strained, which can further increase absorption efficiency as the biaxial strain can transform the germanium or $Si_{1-x}Ge_x$ material to a direct bandgap material.

In addition to fabrication of the light sensing elements or regions 12B, 12R, 12NIR of the blue, green, red, and near-infrared light sensors 10B, 10G, 10R, and 10NIR, front end-of-line (FEOL) processing performed on the front side 16 of the base material 14 may include fabrication of CMOS transistors for logic, memory circuitry, or so forth. After the FEOL processing including the formation of the light sensing elements or regions 12B, 12R, 12NIR of the blue, green, red, and near-infrared light sensors 10B, 10G, 10R, and 10NIR, is complete, back end-of-line (BEOL) processing is performed to form interconnect metallization layers 20 on the front-side 16. The BEOL processing to form the interconnect metallization layers 20 may, for example, include successive deposition and patterning of a metallization layer, followed by deposition of intermetal dielectric (IMD) material and photolithographically defined vias passing through the IMD material, and iterate to form each metallization layer as conductive traces separated by IMD material with the metallization layers connective by the vias.

After the BEOL processing is complete, the support wafer (not shown) is removed from the backside 18 of the thinned silicon wafer or other base semiconductor material 14, and further processing is performed on the backside 18 which is also referred to herein as the light-receiving surface 18 of the array of light detectors. This is because in the final CMOS image sensor incident light 22 is received at the light receiving side 18. This stage of the CMOS image sensor manufacturing includes forming deep trench isolation (DTI) regions including trenches 24 disposed between the light sensors, e.g. running between rows and columns of light sensors. In this regard, it should be noted that FIG. 1 illustrates a portion of what may be a larger CMOS image sensor array. For example, the illustrated blue, green, red, and near-infrared light sensors 10B, 10G, 10R, and 10NIR may constitute one full color+near infrared pixel of an image sensor that may include thousands, tens of thousands, hundreds of thousands, or millions of such full color+near infrared pixels. The trenches 24 provide improved electrical isolation of the constituent light sensors 10B, 10G, 10R, and 10NIR. The depth of the DTI trenches 24 is typically scaled based on the thickness of the base semiconductor wafer 14. As some nonlimiting illustrative examples, the trenches 24 may have depth in a range of 1.5-6 microns. The trenches 24 may subsequently be filled with silicon dioxide or another oxide or other dielectric material to provide electrical isolation between the light sensors 10B, 10G, 10R, and 10NIR. The trenches 24 are suitably formed by etching through openings in a photoresist layer that is patterned using a suitable photomask.

Additionally, the photomask used to form the trenches 24 includes features to form openings through which additional trenches are etched in a light-receiving surface 30 of the near infrared light sensor 10NIR. The trenches may remain open (i.e., air filled), or may be subsequently filled with a metal. In either case, the result is an embedded grating 32 that is formed in the light receiving surface 30 of the near infrared light sensor 10NIR. The spacing of the embedded grating 32 is chosen to support formation of a surface plasmon polariton at the design basis wavelength of the near infrared light sensor 10NIR. The embedded grating 32 is thus configured to couple with light at the design-basis infrared wavelength to form a surface plasmon polariton at the light-receiving surface 30 of the near infrared light sensor 10NIR. In some nonlimiting examples, the design basis wavelength is 940 nanometers, but more generally the design basis wavelength can be any wavelength in the near infrared spectrum (e.g., 700-1400 nanometers in some nonlimiting examples) which is chosen for designing the near infrared light sensor 10NIR. As the trenches for forming the embedded grating 32 are formed together with the DTI trenches 24, the embedded grating 32 may have depth in a range of 1.5-6 microns, again typically scaled in accord with the thickness of the base silicon or other base semiconductor 14.

After formation of the trenches 24 and the embedded grating 32, a metal layer is disposed on the array of light sensors and is patterned to form a patterned metal layer including a metal grid 40 with gridlines extending between the light sensors 10B, 10G, 10R, and 10NIR of the array. Typically, the gridlines of the metal grid 40 are aligned with and disposed on the trenches 24. The metal grid 40 is made of a light absorbing material such as tungsten or another metal, and provides optical isolation of the light sensors 10B, 10G, 10R, and 10NIR of the array to suppress optical crosstalk between the light sensors 10B, 10G, 10R, and 10NIR of the array. Optionally, spaces between the gridlines of the metal grid 40 may be filled with an oxide or other dielectric material to provide a planer top surface. Formation of the metal grid 40 typically entails depositing a metal layer on the light-receiving surface of the array of light sensors and patterning to form the patterned metal layer including the metal grid 40 using etching through openings in a photoresist layer that is patterned using a suitable photomask. In some nonlimiting illustrative embodiments, the metal grid 40 may have a height (i.e. extension away from or "above" the light receiving surface of the array of light sensors) of 0.16-2.0 microns.

Additionally, the photomask used in etching to from the patterned metal layer including the metal grid 40 has additional features to form a metal grating 42 disposed on the light-receiving surface 30 of the near infrared light sensor 10NIR. The spacing of the metal grating 42 is chosen to support formation of a surface plasmon polariton at the design basis wavelength of the near infrared light sensor 10NIR. The metal grating 42 is thus configured to couple with light at the design-basis infrared wavelength to form a surface plasmon polariton at the light-receiving surface 30 of the near infrared light sensor 10NIR. In some nonlimiting examples, the design basis wavelength is 940 nanometers, but more generally the design basis wavelength can be any wavelength in the near infrared spectrum (e.g., 700-1400 nanometers in some nonlimiting examples) which is chosen for designing the near infrared light sensor 10NIR. As the metal grating 42 is formed together with the metal grid 40, the metal grating 42 may have the same height as the metal grid 40, e.g. in some nonlimiting illustrative embodiments the metal grating 42 may have a height of 0.16-2.0 microns.

To provide spectral sensitivity for the color light sensors 10B, 10G, 10R, as shown in FIG. 1 a blue color filter 50B may be disposed over the blue light sensor 10B, a green color filter 50G may be disposed over the green light sensor 10G, and a red color filter 50R may be disposed over the red light sensor 10R. The blue color filter 50B is designed to preferentially pass blue light (e.g., by absorbing light outside of the blue spectral range). The green color filter 50G is designed to preferentially pass green light (e.g., by absorbing light outside of the green spectral range). The red color filter 50R is designed to preferentially pass red light (e.g., by absorbing light outside of the red spectral range). Although not shown, it is contemplated dispose a near infrared filter over the near infrared light sensor 10NIR. The near infrared filter would be designed to preferentially pass near infrared light (e.g., by absorbing light outside of the near infrared spectral range).

As discussed, the embedded grating 32 that is formed in the light receiving surface 30 of the near infrared light sensor 10NIR can serve as a surface plasmon polariton structure configured to couple with light at the design-basis infrared wavelength to form a surface plasmon polariton at the light-receiving surface 30 of the near infrared light sensor 10NIR. It is contemplated to employ the embedded grating 32 alone (that is, without the metal grating 42) as the surface plasmon polariton structure.

As also discussed, the metal grating 42 that is disposed on the light receiving surface 30 of the near infrared light sensor 10NIR can serve as a surface plasmon polariton structure configured to couple with light at the design-basis infrared wavelength to form a surface plasmon polariton at the light-receiving surface 30 of the near infrared light sensor 10NIR. It is contemplated to employ the metal grating 42 alone (that is, without the embedded grating 32) as the surface plasmon polariton structure.

In the illustrative example, both the metal grating 42 and the embedded grating 32 are included, with the embedded grating 32 aligned with and underlying the metal grating 42. Thus, in the illustrative example the combination of the embedded grating 32 and the metal grating 42 form the surface plasmon polariton structure that is configured to couple with light at the design-basis infrared wavelength to form a surface plasmon polariton at the light-receiving surface 30 of the near infrared light sensor 10NIR. This approach has an advantage in that the surface plasmon polariton structure extends both above (via the metal grid 42) and below (via the embedded grid 32) the light receiving surface 30 of the near infrared light sensor 10NIR. In this way, the surface plasmon polariton is strengthened, thereby synergistically increasing the optical coupling of near infrared light sensor at or around the design basis infrared wavelength with the near infrared light sensor 10NIR.

Figure 2:
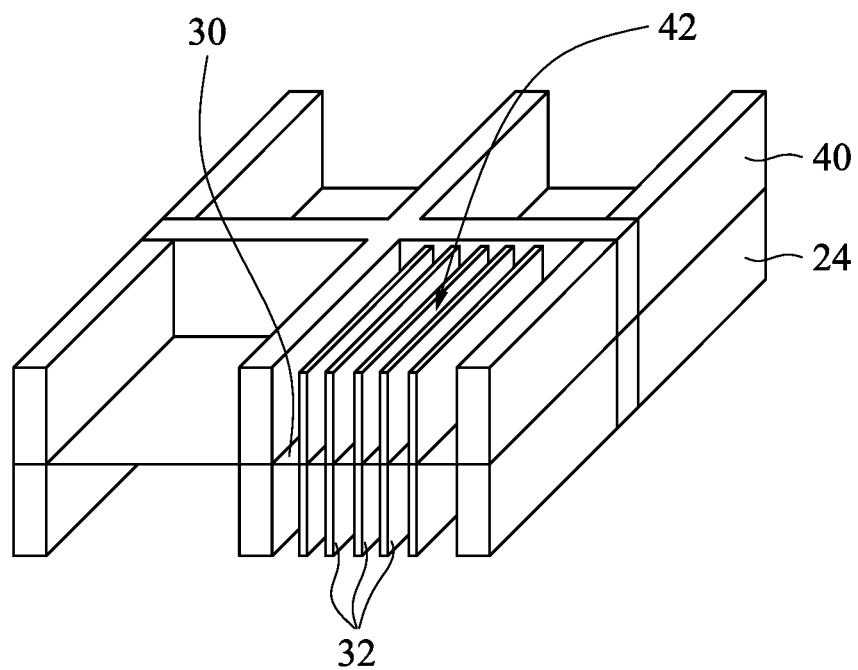
FIG. 2 diagrammatically illustrates a perspective isolation view of the patterned metal layer and the trenches and the embedded grating of the CMOS image sensor of FIG. 1.

With reference now to FIG. 2, to provide further illustration a perspective isolation view is shown of the patterned metal layer (including the metal grid 40 and the metal grating 42 disposed on the light-receiving surface 30 of the near infrared light sensor 10NIR) and the DTI trenches 24 underlying the metal grid 40 and the embedded grating 32 underlying the metal grating 42.

Figure 3:
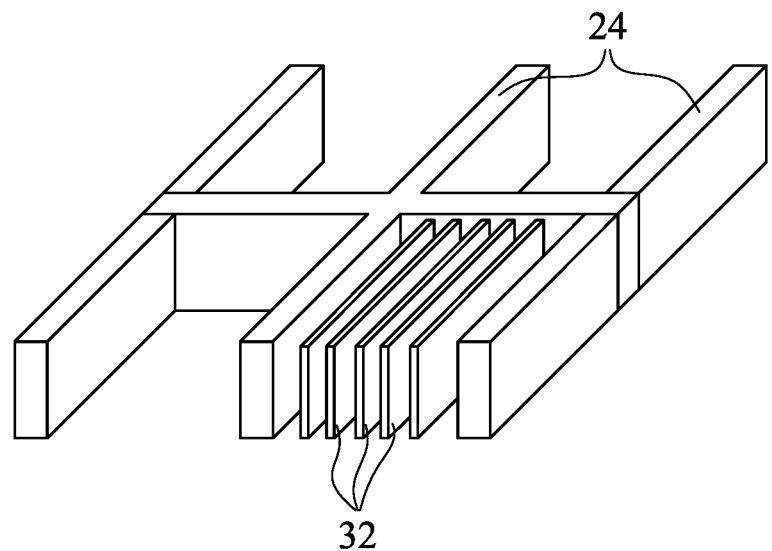
FIG. 3 diagrammatically illustrates a perspective isolation view of the trenches and the embedded grating of the CMOS image sensor of FIG. 1.

With reference now to FIG. 3, to provide yet further illustration a perspective isolation view is shown of the DTI trenches 24 and the embedded grating 32 underlying the metal grating 42.

Figure 4:
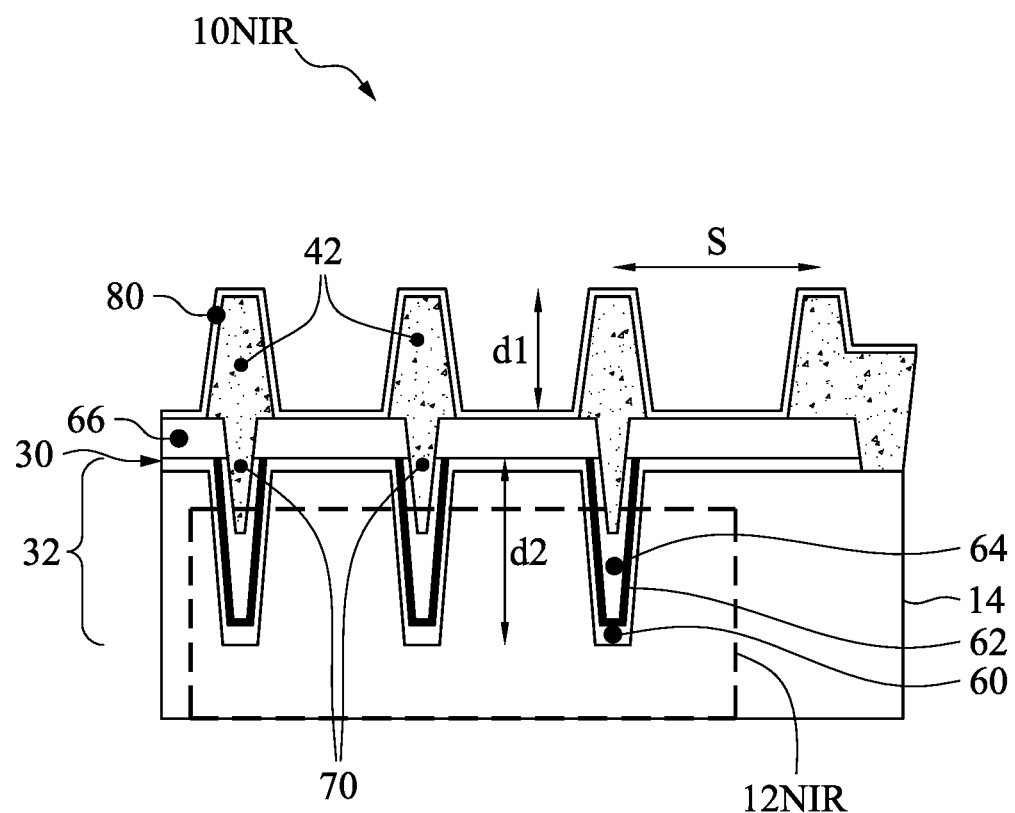
FIG. 4 diagrammatically illustrates a side sectional view of an embodiment of a near infrared light sensor 10NIR in which an embedded grating of a surface plasmon polariton structure comprises a metal grid.

With reference now to FIG. 4, an illustrative embodiment of a near infrared light sensor 10NIR is shown by way of side sectional view, in which the embedded grating 32 comprises a metal grid. The near infrared light sensor 10NIR of FIG. 4 includes a light sensing element or region 12NIR formed in a base semiconductor material 14. As previously described with reference to FIG. 1, the base semiconductor material 14 may in some embodiments comprise a silicon wafer. In some nonlimiting illustrative embodiments, the silicon wafer 14 may have a thickness in a range of 2.5 microns to 10 microns. As further previously described with reference to FIG. 1, the light sensing element or region 12NIR may in some embodiments comprise a photodiode, such as a p/n diode, a pinned photodiode, or so forth; and may optionally include germanium or $Si_{1-x}Ge_x$ (where 0<x<1) formed as an epitaxial layer or as a diffused, implanted, or otherwise-formed region containing germanium, in order to improve the absorption coefficient for near infrared light.

The embedded grating 32 of the embodiment of FIG. 4 is suitably formed in this embodiment as follows. Photolithographically defined etching is performed to form trenches. The walls of the trenches may optionally be coated with one or more dielectric layers, such as in the illustrative example a high-k dielectric layer 60 (e.g., hafnium silicate, zirconium silicate, hafnium dioxide, zirconium dioxide, et cetera), an etch stop layer 62 (e.g., silicon nitride), and an oxide layer 64. Next, a buffer oxide layer 66 is deposited on the light-receiving surface 30 of the near infrared light sensor 10NIR and planarization of the DTI trenches is performed using the oxide layer 66. The trenches are then filled with a suitable metal such as tungsten to form a metal grating 70. In the illustrative embodiment, the one or more dielectric layers 60, 62, 64 are disposed on the metal grating 70. In some nonlimiting illustrative embodiments, the embedded grating 32 may have a total height (or depth) d2 of between 1.5 micron and 6 micron, typically scaled by the thickness of the base silicon wafer 14 which may have a thickness of 2.5-10 microns. These are merely nonlimiting illustrative examples.

Subsequently, the patterned metal layer including the metal grid 42 is formed on the light-receiving surface 30 of the near infrared light sensor 10NIR (and more specifically on the oxide layer 66). In some embodiments, the metal grid 42 comprises tungsten. The metal grid 42 may have a height d1 which in some nonlimiting illustrative embodiments may be 0.16 micron to 2.0 micron. Optionally, a protective oxide layer 80 may be deposited over the surface.

Figure 5:
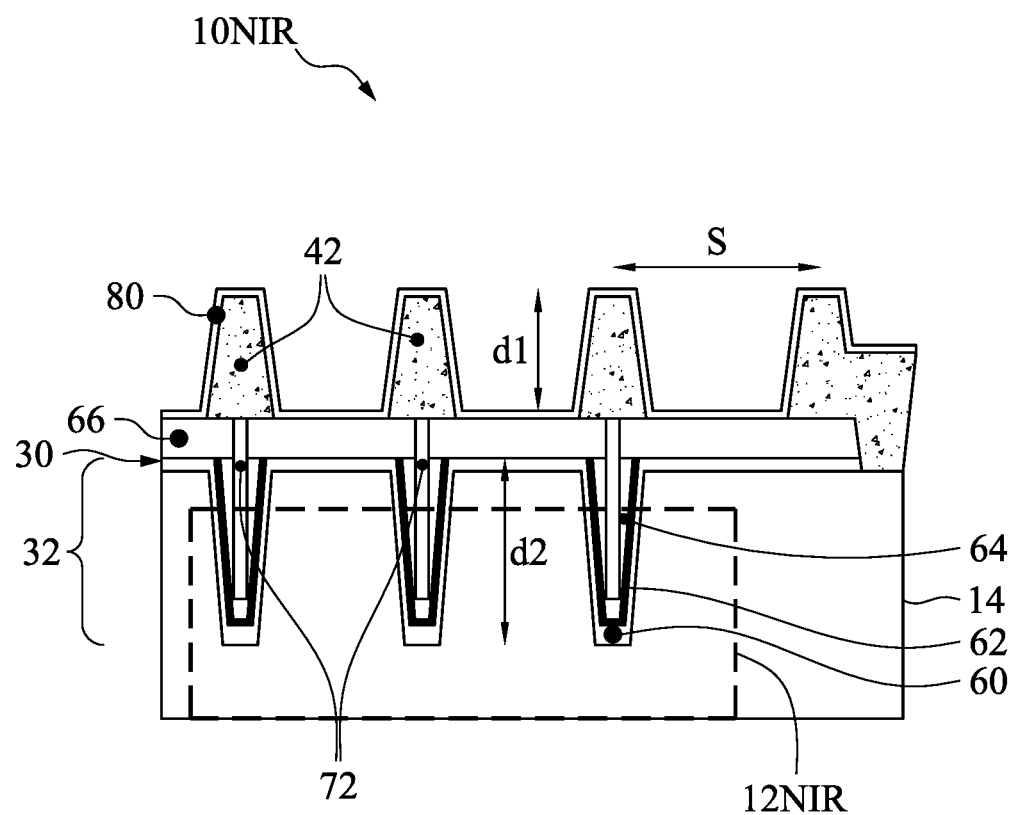
FIG. 5 diagrammatically illustrates a side sectional view of an embodiment of a near infrared light sensor 10NIR in which an embedded grating of a surface plasmon polariton structure comprises trenches which are at least partly air filled.

With reference now to FIG. 5, an illustrative embodiment of a near infrared light sensor 10NIR is shown by way of side sectional view, in which the embedded grating 32 comprises trenches which are at least partially air filled. The near infrared light sensor 10NIR of FIG. 5 includes a light sensing element or region 12NIR formed in a base semiconductor material 14. As previously described with reference to FIG. 1, the base semiconductor material 14 may in some embodiments comprise a silicon wafer. In some nonlimiting illustrative embodiments, the silicon wafer 14 may have a thickness in a range of 2.5 microns to 10 microns. As further previously described with reference to FIG. 1, the light sensing element or region 12NIR may in some embodiments comprise a photodiode, such as a p/n diode, a pinned photodiode, or so forth; and may optionally include germa-nium or $Si_{1-x}Ge_x$ (where 0<x<1) formed as an epitaxial layer or as a diffused, implanted, or otherwise-formed region containing germanium, in order to improve the absorption coefficient for near infrared light.

The embedded grating 32 of the embodiment of FIG. 5 is suitably formed in this embodiment as follows. Photolithographically defined etching is performed to form trenches. The walls of the trenches may optionally be coated with one or more dielectric layers, such as in the illustrative example a high-k dielectric layer 60 (e.g., hafnium silicate, zirconium silicate, hafnium dioxide, zirconium dioxide, et cetera), an etch stop layer 62 (e.g., silicon nitride), and an oxide layer 64. The remainder of the trenches is left unfilled, so that the embedded grating 32 comprises the trenches partly filled with air 72. Next, a buffer oxide layer 66 is deposited on the light-receiving surface 30 of the near infrared light sensor 10NIR and planarization of the DTI trenches is performed using the oxide layer 66. In some nonlimiting illustrative embodiments, the embedded grating 32 may have a total height (or depth) d2 of between 1.5 micron and 6 micron, typically scaled by the thickness of the base silicon wafer 14 which may have a thickness of 2.5-10 microns. These are merely nonlimiting illustrative examples.

Subsequently, the patterned metal layer including the metal grid 42 is formed on the light-receiving surface 30 of the near infrared light sensor 10NIR (and more specifically on the oxide layer 66). In some embodiments, the metal grid 42 comprises tungsten. The metal grid 42 may have a height d1 which in some nonlimiting illustrative embodiments may be 0.16 micron to 2.0 micron. Optionally, a protective oxide layer 80 may be deposited over the surface.

Figure 6:
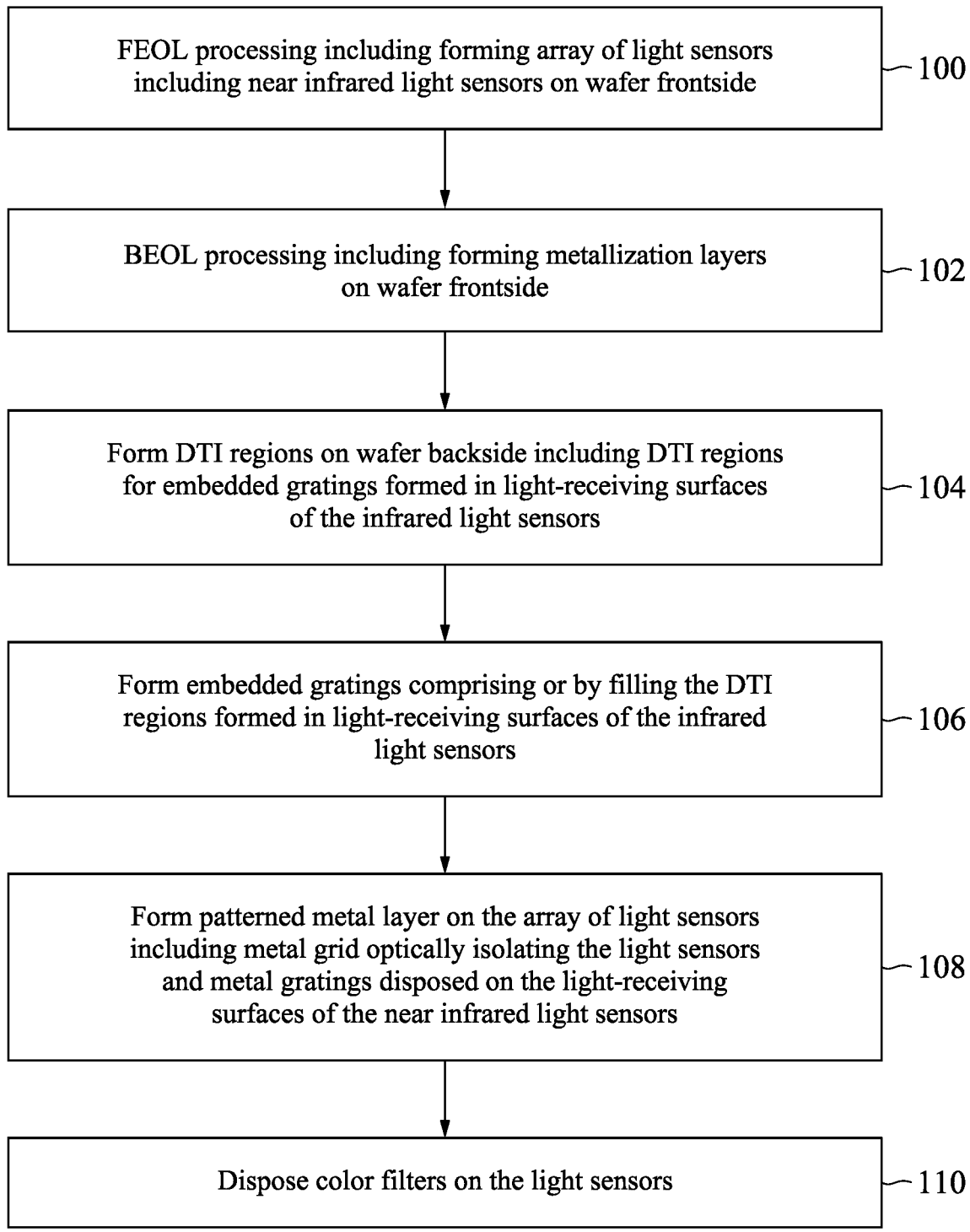
FIG. 6 diagrammatically shows a workflow for fabricating a CMOS image sensor.

With reference now to FIG. 6, a suitable workflow for fabricating a CMOS image sensor is described. In an operation 100, FEOL processing is performed on a frontside 16 of a silicon wafer or other base semiconductor 14 to form the array of light sensors 10B, 10G, 10R, 10NIR, e.g. as shown in FIG. 1, including near infrared light sensors 10NIR. This can employ typical CMOS image sensor processing to form suitable pinned p/n diodes or other suitable light sensitive elements or regions in a thinned silicon substrate, for example. For the near infrared light sensors 10NIR, germanium may optionally be incorporated to reduce the bandgap and improve absorption of near infrared light.

In an operation 102, BEOL processing is performed to form interconnect metallization layers 20 on the frontside 16 of the base semiconductor 14. This typically entails alternating between deposition of intermetal dielectric (IMD) and deposition/patterning of metal layers, with formation of vias through the IMD to connect between the patterned metal layers.

In an operation 104, deep trench isolation (DTI) regions are formed on the backside 18 of the base semiconductor 14. These include the trenches 24 for electrical isolation of the individual light sensors 10B, 10G, 10R, 10NIR, along with trenches in the light-receiving surfaces 30 of the near infrared light sensors 10NIR for forming the embedded grating 32. Advantageously, the same photomask and DTI etching process can be used to form both the trenches 24 and the trenches for the embedded grating 32.

In an operation 106, the embedded gratings 32 are formed in the trenches in the light-receiving surfaces 30 of the near infrared light sensors 10NIR. This can entail filling the trenches with metal to form the embedded gratings 32 comprising embedded metal gratings 70 as diagrammatically shown in FIG. 4, or can entail leaving the trenches at least partly filled with air 72 as diagrammatically shown in FIG. 5 to form the embedded grating 32 as trenches that are at least partly air filled.

In an operation 108, a patterned metal layer is formed on the array of light sensors, including the metal grid 40 optically isolating the individual light sensors 10B, 10G, 10R, 10NIR to reduce optical crosstalk, and the metal grids 42 formed on the light-receiving surfaces 30 of the near infrared light sensors 10NIR.

In an optional operation 110, blue color filters 50B may be disposed over the blue light sensors 10B, green color filters 50G may be disposed over the green light sensors 10G, and a red color filters 50R may be disposed over the red light sensors 10R. Although not shown, optionally infrared filters may also be disposed over the near infrared light sensors 10NIR.

The illustrative examples integrate the illustrative near infrared light sensor 10NIR having the illustrative surface plasmon polariton structure 32, 42 with blue, green, and red color light sensors 10B, 10G, and 10R to provide a CMOS imaging sensor with both color imaging and infrared imaging capability. Such a CMOS imaging sensor can, for example, be used to provide both color imaging using the color light sensors 10B, 10G, and 10R under bright light conditions, and monochrome infrared imaging using the near infrared light sensors 10NIR (or, alternatively, fused infrared/color images by image processing). In another example, such a CMOS imaging sensor can be used to provide a color image acquired using the color light sensors 10B, 10G, and 10R along with a range image generated by time-of-flight (TOF) processing of an infrared image acquired using the using the near infrared light sensors 10NIR in conjunction with a pulsed infrared light source. These are merely illustrative examples.

However, it will be appreciated that an array of the illustrative near infrared light sensor 10NIR having the illustrative surface plasmon polariton structure 32, 42 can be constructed without red, green, and blue (or other visible light) sensors, to form a high sensitivity infrared imaging array.

Still further, while the illustrative examples employ near infrared light sensors 10NIR implemented in CMOS technology to form CMOS image sensors, the disclosed approach of integrating a surface plasmon polariton structure 32, 42 in the light-receiving surfaces of near infrared light sensors can be employed in conjunction with near infrared light sensors fabricated in other technologies besides CMOS.

In the following, some further embodiments are described.

In a nonlimiting illustrative embodiment, a light sensor array comprises: an array of light sensors including infrared light sensors configured to detect infrared light at least at a design-basis infrared wavelength; a patterned metal layer disposed on the array of light sensors, the patterned metal layer including metal gridlines disposed between the light sensors of the array of light sensors and metal gratings disposed on light-receiving surfaces of the respective infrared light sensors; and embedded gratings formed in the light-receiving surfaces of the respective infrared light sensors and aligned with and underlying the respective metal gratings. The metal grating and aligned embedded grating of each respective infrared light sensor forms a surface plasmon polariton structure configured to couple with light at the design-basis infrared wavelength to form a surface plasmon polariton at the light-receiving surface of the respective infrared light sensor.

In a nonlimiting illustrative embodiment, a method of fabricating a near infrared light sensor device is disclosed. The method comprises: providing a near infrared light sensor configured to detect infrared light at least at a design-basis infrared wavelength; forming an embedded grating in a light-receiving surface of the near infrared light sensor; and forming a metal grating on the embedded grating. The combination of the embedded grating and the metal grating forms a surface plasmon polariton structure configured to couple with light at the design-basis infrared wavelength to form a surface plasmon polariton at the light-receiving surface of the near infrared light sensor.

In a nonlimiting illustrative embodiment, a near infrared sensing device includes a near infrared light sensor configured to detect infrared light at least at a design-basis infrared wavelength, and a surface plasmon polariton structure including at least an embedded grating that is embedded in a light-receiving surface of the near infrared light sensor. The surface plasmon polariton structure is configured to couple with light at the design-basis infrared wavelength to form a surface plasmon polariton at the light-receiving surface of the near infrared light sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light sensor array comprising:
    an array of light sensors including infrared light sensors configured to detect infrared light at least at a design-basis infrared wavelength;
    a patterned metal layer disposed on the array of light sensors, the patterned metal layer including metal gridlines disposed between the light sensors of the array of light sensors and metal gratings disposed on light-receiving surfaces of the respective infrared light sensors; and
    embedded gratings formed in the light-receiving surfaces of the respective infrared light sensors and aligned with and underlying the respective metal gratings;
    wherein the metal grating and aligned embedded grating of each respective infrared light sensor forms a surface plasmon polariton structure configured to couple with light at the design-basis infrared wavelength to form a surface plasmon polariton at the light-receiving surface of the respective infrared light sensor.

2. The light sensor array of claim 1, wherein the array of light sensors comprises a CMOS image sensor array formed on and/or in a silicon base material.

3. The light sensor array of claim 2, wherein the embedded gratings comprise embedded metal gratings embedded in the light-receiving surfaces of the respective infrared light sensors.

4. The light sensor array of claim 3, wherein the embedded metal grating of each respective infrared light sensor is an extension of the metal grating disposed on the light-receiving surface of the respective infrared light sensor into the light-receiving surface of the respective infrared light sensor.

5. The light sensor array of claim 4, wherein the embedded metal gratings are made of tungsten and the metal gratings are made of tungsten.

6. The light sensor array of claim 3, wherein the embedded gratings further comprise at least one dielectric layer disposed on the embedded metal gratings.

7. The light sensor array of claim 2, wherein the embedded gratings comprise trenches formed in the light-receiving surfaces of the respective infrared light sensors, wherein the trenches are at least partially filled with air.

8. The light sensor array of claim 7, wherein the trenches are lined with at least one dielectric layer.

9. The light sensor array of claim 1, wherein the array of light sensors further include red light sensors configured to detect red light, blue light sensors configured to detect blue light, and green light sensors configured to detect green light, and wherein the light sensor array further comprises:
   red filters optically coupled with the red light sensors;
   blue filters optically coupled with the blue light sensors; and
   green filters optically coupled with the green light sensors.

10. A method of fabricating a near infrared light sensor device, the method comprising:
   providing a near infrared light sensor configured to detect infrared light at least at a design-basis infrared wavelength;
   forming an embedded grating in a light-receiving surface of the near infrared light sensor; and
   forming a metal grating on the embedded grating;
   wherein the combination of the embedded grating and the metal grating forms a surface plasmon polariton structure configured to couple with light at the design-basis infrared wavelength to form a surface plasmon polariton at the light-receiving surface of the near infrared light sensor.

11. The method of claim 10, wherein the forming of the embedded grating includes:
   forming trenches in the light-receiving surface of the near infrared light sensor; and
   disposing a metal in the trenches.

12. The method of claim 11, wherein the embedded metal disposed in the trenches is tungsten and the metal grating is made of tungsten.

13. The method of claim 11, wherein the forming of the embedded grating further includes:
   prior to disposing the metal in the trenches, lining the trenches with at least one dielectric layer.

14. The method of claim 10, wherein the forming of the embedded grating includes:
   forming trenches in the light-receiving surface of the near infrared light sensor, the trenches being at least partly filled with air;
   wherein the embedded grating comprises the trenches at least partially filled with air.

15. The method of claim 14, wherein the forming of the trenches includes:
   disposing at least one dielectric layer on an inside surface of the trenches.

16. The method of claim 10, wherein:
   the providing of the near infrared light sensor comprises providing an array of light sensors including the near infrared light sensor;
   the forming of the embedded grating includes forming trenches electrically separating the light sensors of the array of light sensors and forming trenches in the light-receiving surface of the near infrared light sensor;
   wherein the embedded grating comprises the trenches formed in the light-receiving surface of the near infrared light sensor and at least partially filled with air or a metal.

17. A near infrared sensing device comprising:
   a near infrared light sensor configured to detect infrared light at least at a design-basis infrared wavelength; and
   a surface plasmon polariton structure including at least an embedded grating that is embedded in a light-receiving surface of the near infrared light sensor, the surface plasmon polariton structure configured to couple with light at the design-basis infrared wavelength to form a surface plasmon polariton at the light-receiving surface of the near infrared light sensor.

18. The near infrared sensing device of claim 17, wherein the surface plasmon polariton structure further includes:
   a metal grating disposed on the light-receiving surface of the near infrared light sensor and aligned with the embedded grating.

19. The near infrared sensing device of claim 17, wherein the embedded grating comprises an embedded metal grating that is embedded in the light-receiving surface of the near infrared light sensor.

20. The near infrared sensing device of claim 17, wherein the embedded grating comprises trenches formed in the light-receiving surface of the near infrared light sensor and at least partially filled with air.

* * * * *